United States Patent
Wang

(10) Patent No.: US 11,205,725 B2
(45) Date of Patent: Dec. 21, 2021

(54) BUFFER STRUCTURE, DISPLAY PANEL, AND MANUFACTURING METHOD OF BUFFER STRUCTURE

(71) Applicant: Wuhan China Star Optoelectronics Semiconductor Display Technology Co., Ltd., Wuhan (CN)

(72) Inventor: Kun Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 168 days.

(21) Appl. No.: 16/625,741

(22) PCT Filed: Nov. 4, 2019

(86) PCT No.: PCT/CN2019/115436
§ 371 (c)(1),
(2) Date: Dec. 22, 2019

(87) PCT Pub. No.: WO2021/017239
PCT Pub. Date: Feb. 4, 2021

(65) Prior Publication Data
US 2021/0217893 A1 Jul. 15, 2021

(30) Foreign Application Priority Data
Aug. 1, 2019 (CN) .......................... 201910705393.9

(51) Int. Cl.
*H01L 29/786* (2006.01)
*H01L 51/00* (2006.01)
*H01L 51/52* (2006.01)

(52) U.S. Cl.
CPC .... *H01L 29/78603* (2013.01); *H01L 29/7869* (2013.01); *H01L 29/78654* (2013.01); *H01L 29/78675* (2013.01); *H01L 51/0097* (2013.01); *H01L 51/5253* (2013.01); *H01L 2251/5338* (2013.01)

(58) Field of Classification Search
CPC ......... H01L 29/78603; H01L 29/78654; H01L 29/78675; H01L 29/7869
See application file for complete search history.

(56) References Cited

U.S. PATENT DOCUMENTS

| 2013/0217168 | A1* | 8/2013 | Hartmann | H01L 51/448 438/64 |
| 2018/0337332 | A1* | 11/2018 | Deng | H01L 27/3248 |
| 2019/0252641 | A1* | 8/2019 | Zhang | H01L 51/524 |
| 2020/0119154 | A1* | 4/2020 | Cao | H01L 29/66742 |
| 2020/0251683 | A1* | 8/2020 | Sun | H01L 51/0096 |
| 2021/0119156 | A1* | 4/2021 | Li | C03C 17/32 |

\* cited by examiner

Primary Examiner — Eugene Lee

(57) ABSTRACT

The present disclosure provides a buffer structure, a display panel, and a manufacturing method of the buffer structure. The display panel comprises at least one of the buffer structures. The buffer structure comprises a first inorganic layer, a second inorganic layer, and an organic layer. Trapezoidal grooves are disposed at intervals on one side surface of the first inorganic layer; the second inorganic layer is disposed on one side surface having the trapezoidal grooves of the first inorganic layer, covers inside surfaces of the trapezoidal grooves, is connected at openings of the trapezoidal grooves, and forms capillary channels; and the organic layer is filled inside the capillary channels.

10 Claims, 4 Drawing Sheets

BUFFER STRUCTURE, DISPLAY PANEL, AND MANUFACTURING METHOD OF BUFFER STRUCTURE

RELATED APPLICATIONS

This application is a National Phase of PCT Patent Application No. PCT/CN2019/115436 having International filing date of Nov. 4, 2019, which claims the benefit of priority of Chinese Patent Application No. 201910705393.9 filed on Aug. 1, 2019. The contents of the above applications are all incorporated by reference as if fully set forth herein in their entirety.

FIELD AND BACKGROUND OF THE INVENTION

The present disclosure relates to the field of display panel processing technologies, and more particularly to a buffer structure, a display panel, and a manufacturing method of the buffer structure.

Organic light-emitting diodes (OLEDs) devices have advantages of a simple structure, fast response times, active illumination, and low power consumption. Therefore, they have been widely used in display fields such as mobile phones, tablets, and televisions. With development of product differentiation, flexible and foldable screens have become a trend. Flexible OLED devices comprise a display portion, a drive integrated circuit, and a metal wiring connected to both, wherein the drive integrated circuit is disposed on a lower frame of display panels. At present, more and more mobile phone manufacturers are trying to launch a bendable mobile phone, requiring the number of bending screens to reach a commercial level. There are many inorganic membranes with high stress in an OLED panel structure, which mainly comprise an array substrate and thin film encapsulation related film layers, and bending resistances of these film layers directly affect the bending number of the entire panel.

U.S. Pat. No. 8,937,394 discloses a layered structure of encapsulation film layers as shown in FIG. 1, wherein the structure comprises an OLED display substrate 1200 and an interlaced organic-inorganic encapsulation layer 1214. Each layer 2102a, 1204a, 2102b, 1204b of the organic-inorganic encapsulation layer comprises organic layers 1208 and inorganic layers 1206 disposed at intervals. Wherein an area of the organic layers 1208 is greater than the inorganic layers 1206 that the organic-inorganic encapsulation layer 1214 stacked in this way can effectively reduce bending stresses in the bending process, improving bending properties of screens. However, such stacked encapsulated layer makes the organic layers connected together and form a complete water oxygen channel that decreases water and oxygen resistance of the encapsulating film, thereby reducing service life of screens.

Therefore, a new type of buffer structure, display panel, and a manufacturing method of the buffer structure are needed to solve the problem in current technology.

An object of the present disclosure is to provide a buffer structure, a display panel, and a manufacturing method of the buffer structure. It can effectively reduce the bending stress of inorganic layers, increase bendable numbers of display panels, and not affect an insulating ability of inorganic layers to water and oxygen by using etching to form trapezoidal grooves on inorganic films of a display panel, and forming capillary channels inside the trapezoidal grooves, making liquid organics enter the capillary channels and cured to form an organic layer.

SUMMARY OF THE INVENTION

To solve the above problems, an embodiment of the present disclosure provides a buffer structure. The buffer structure comprises a first inorganic layer, a second inorganic layer, and an organic layer. Specifically, trapezoidal grooves are disposed on one side surface of the first inorganic layer at intervals, and an opening width of the trapezoidal grooves is less than a bottom width of the grooves; the second inorganic layer is disposed on one side surface having the trapezoidal grooves of the first inorganic layer, covers inside surfaces of the trapezoidal grooves, is connected at openings of the trapezoidal grooves, and forms capillary channels; and the organic layer is filled inside the capillary channels.

In an embodiment of the present disclosure, the capillary channels are parallelly arranged linear structures or spirally arranged ring structures.

In an embodiment of the present disclosure, a spacing between the adjacent trapezoidal grooves ranges from 100 nm to 500,000 nm.

In an embodiment of the present disclosure, the opening width of the trapezoidal grooves ranges from 100 nm to 5000 nm.

In an embodiment of the present disclosure, a thickness of the second inorganic layer ranges from 50 nm to 2500 nm.

In an embodiment of the present disclosure, the first inorganic layer is a layered structure consisting of a buffer layer and an active layer, wherein the buffer layer is a single layer structure of a silicon nitride layer or a silicon oxide layer, or is a double layer structure consisting of a silicon nitride layer and a silicon oxide layer, and a material of the active layer comprises at least one of indium gallium zinc oxide (IGZO), monocrystalline silicon (a-Si), low temperature poly-silicon (LTPS), or low temperature polycrystalline oxide (LTPO);

a gate insulation layer, a material of the gate insulation layer comprises at least one of SiNx or SiOx;

an interlayer insulation layer, a material of the interlayer insulation layer comprises SiNx or SiOx; or a passivation layer, a material of the passivation layer comprises SiNx or SiOx.

In an embodiment of the present disclosure, a material of the second inorganic layer comprises one of SiNx, SiOxNy, SiOx, SiCxNy, ZnO, or AlOx.

In an embodiment of the present disclosure, a material of the organic layer comprises epoxy resins or acrylics.

Another embodiment of the present disclosure provides a manufacturing method of the buffer structure. The method comprises following steps:

preparing a first inorganic layer: providing the first inorganic layer and disposing trapezoidal grooves at intervals on one side surface of the first inorganic layer by etching, wherein an opening width of the trapezoidal grooves is less than a bottom width of the grooves;

preparing a second inorganic layer: depositing the second inorganic layer on one side surface having the trapezoidal grooves of the first inorganic layer by an atomic layer deposition (ALD) process, a pulsed laser deposition (PLD) process, a sputtering process, or a plasma enhanced chemical vapor deposition (PECVD) process, and adjusting a thickness and a film formation parameter of the second inorganic layer to make the second inorganic layer connected at openings of the trapezoidal grooves to form capillary channels; and preparing an organic layer: using capillarity of the capillary channels to add liquid organics dropwise at terminals of the capillary channels, the organics filling up the capillary channels due to capillarity and cured by ultraviolet (UV) light to form the organic layer.

An embodiment of the present disclosure further provides a display panel. The display panel comprises at least one of the above buffer structures.

The beneficial effect of the present disclosure is that: to provide a buffer structure, a display panel, and a manufacturing method of the buffer structure. It can effectively reduce the bending stress of inorganic layers, increase bendable numbers of display panels, and not affect an insulating ability of inorganic layers to water and oxygen by using etching to form trapezoidal grooves on an inorganic film (that is the first inorganic layer) of a display panel, then deposing a layer of inorganic film, adjusting a thickness of the inorganic film to make the inorganic film (that is the second inorganic layer) connected at openings of the trapezoidal grooves, and forming capillary channels inside the trapezoidal grooves, using capillarity to make liquid organics enter the capillary channels and cured to form an organic layer that the organic layer penetrates between the inorganic layers.

DESCRIPTION OF SPECIFIC EMBODIMENTS OF THE INVENTION

Figure 1:
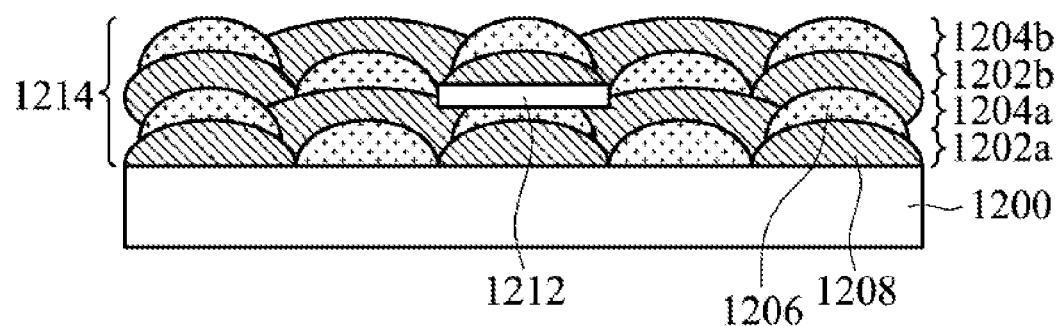
FIG. 1 is a schematic structural diagram of a current display panel.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In the drawings, the thickness of layers and regions are exaggerated for clarity. For example, the thickness and size of the elements in the drawings are arbitrarily shown for ease of description, and thus the technical scope described is not limited by the drawings.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

Figure 2:
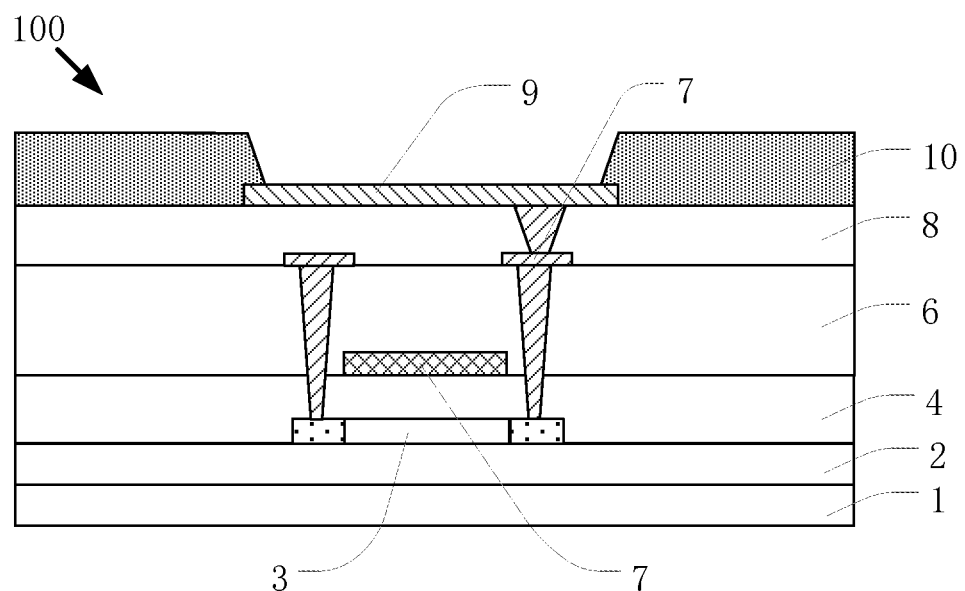
FIG. 2 is a schematic structural diagram of a display panel according to an embodiment of the present disclosure.

Referring to FIG. 2, an embodiment of the present disclosure provides a display panel 100. The display panel 100 comprises at least one of buffer structures 110. Wherein, the display panel 100 comprises a flexible substrate layer 1, a buffer layer 2, an active layer 3, a gate insulation layer 4, a gate electrode layer 5, an interlayer insulation layer 6, a source/drain electrode layer 7, a passivation layer 8, an anode layer 9, and a pixel definition layer 10.

Figure 3:
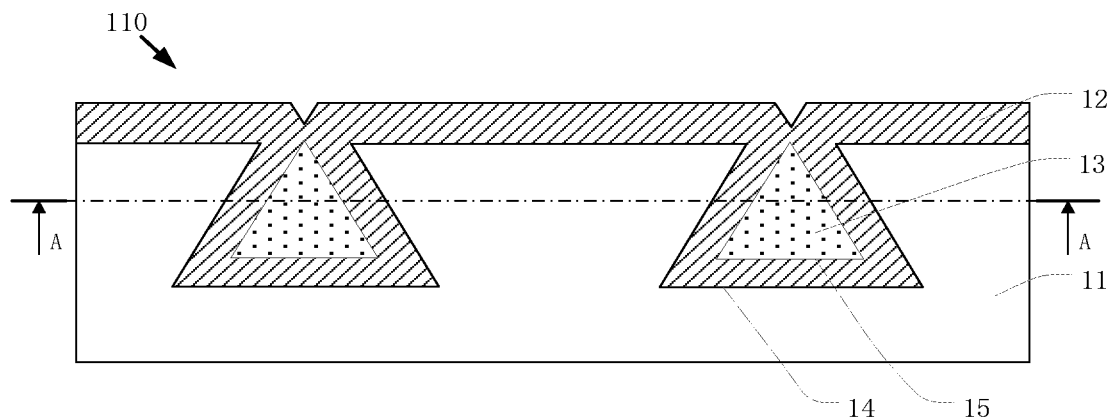
FIG. 3 is a schematic structural diagram of a buffer structure according to an embodiment of the present disclosure.

As shown in FIG. 3, the buffer structure 110 comprises a first inorganic layer 11, a second inorganic layer 12, and an organic layer 13. Specifically, trapezoidal grooves 14 are disposed on one side surface of the first inorganic layer 11 at intervals, and an opening width of the trapezoidal grooves 14 is less than a bottom width of the grooves; the second inorganic layer 12 is disposed on one side surface having the trapezoidal grooves 14 of the first inorganic layer 11, covers inside surfaces of the trapezoidal grooves 14, is connected at openings of the trapezoidal grooves 14, and forms capillary channels 15; and the organic layer 13 is filled inside the capillary channels 15. A shape of the trapezoidal grooves 14 can make the second inorganic layer 12 connected at openings of the trapezoidal grooves 14 to form the capillary channels 15.

Figure 4:
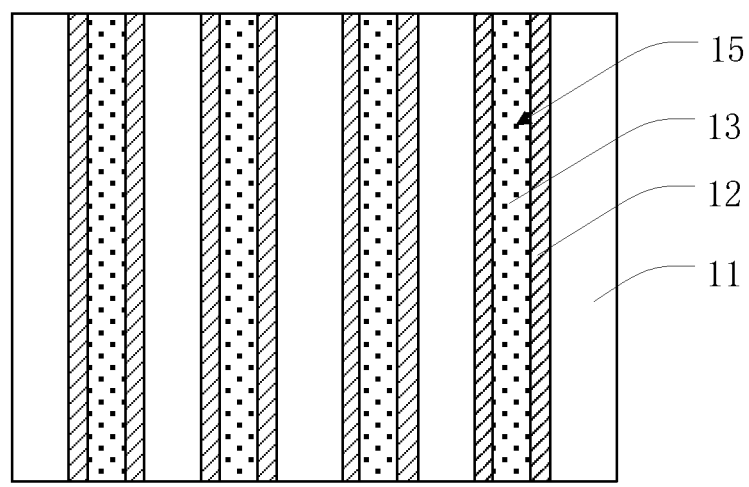
FIG. 4 is a cross-sectional diagram along the direction of A-A in FIG. 3, and is a schematic diagram of capillary channels that are parallelly arranged linear structures.
Figure 5:
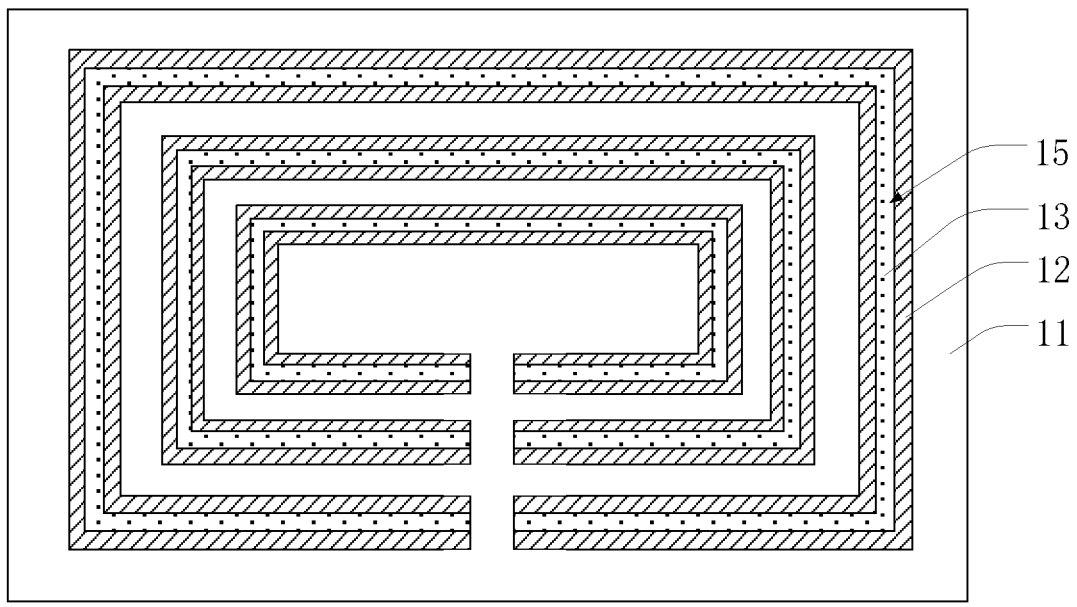
FIG. 5 is a cross-sectional diagram along the direction of A-A in FIG. 3, and is a schematic diagram of capillary channels that are spirally arranged ring structures.

In the embodiment, FIG. 4 and FIG. 5 are cross-sectional diagrams along the A-A direction in FIG. 3. As shown in FIG. 4, the capillary channels 15 are parallelly arranged linear structures, or as shown in FIG. 5, the capillary channels 15 are spirally arranged ring structures. Both the structures can achieve filling the organic layer 13 into the capillary channels 15, thereby effectively reducing the bending stress of the first inorganic layer 11, increasing bendable numbers of the display panel 100, and not affecting an insulating ability of the first inorganic layer 11 to water and oxygen.

In the embodiment, the spacing between the adjacent trapezoidal grooves 14 ranges from 100 nm to 500,000 nm.

In the embodiment, the opening width of the trapezoidal grooves 14 ranges from 100 nm to 5000 nm. The range of the opening width limited can facilitate realizing formation of the capillary channels 15.

In the embodiment, the thickness of the second inorganic layer 12 ranges from 50 nm to 2500 nm. By adjusting the thickness value of the second inorganic layer 12 to realize the second inorganic layer 12 connected at openings of the trapezoidal grooves 14 to form the capillary channels 15.

In the embodiment, the first inorganic layer 11 is:
a layered structure consisting of a buffer layer 2 and an active layer 3, wherein the buffer layer 2 is a single layer structure of a silicon nitride layer or a silicon oxide layer, or is a double layer structure consisting of a silicon nitride layer and a silicon oxide layer, and a material of the active layer 3 comprises at least one of indium gallium zinc oxide (IGZO), monocrystalline silicon (a-Si), low temperature poly-silicon (LTPS), or low temperature polycrystalline oxide (LTPO);

the gate insulation layer 4, a material of the gate insulation layer 4 comprises at least one of SiNx or SiOx;

the interlayer insulation layer 6, a material of the interlayer insulation layer 6 comprises SiNx or SiOx; or the passivation layer 8, a material of the passivation layer 8 comprises SiNx or SiOx.

In the embodiment, the material of the second inorganic layer 12 comprises one of SiNx, SiOxNy, SiOx, SiCxNy, ZnO, or AlOx.

In the embodiment, the material of the organic layer 13 comprises epoxy resins or acrylics.

Figure 6:
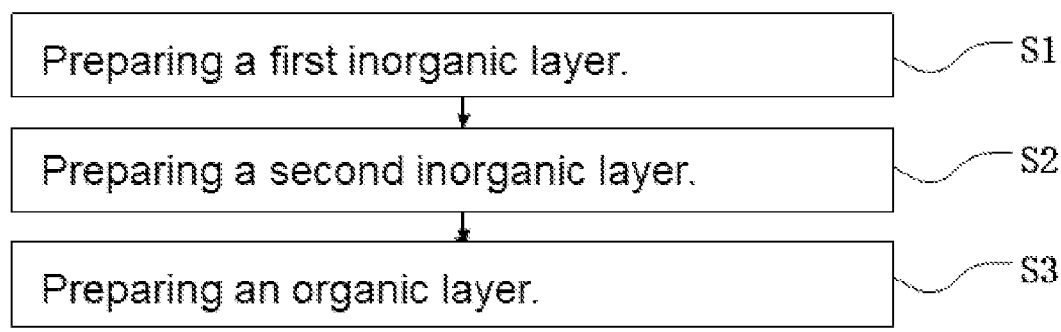
FIG. 6 is a flowchart of a manufacturing method of the buffer structure according to an embodiment of the present disclosure.
Figure 7:
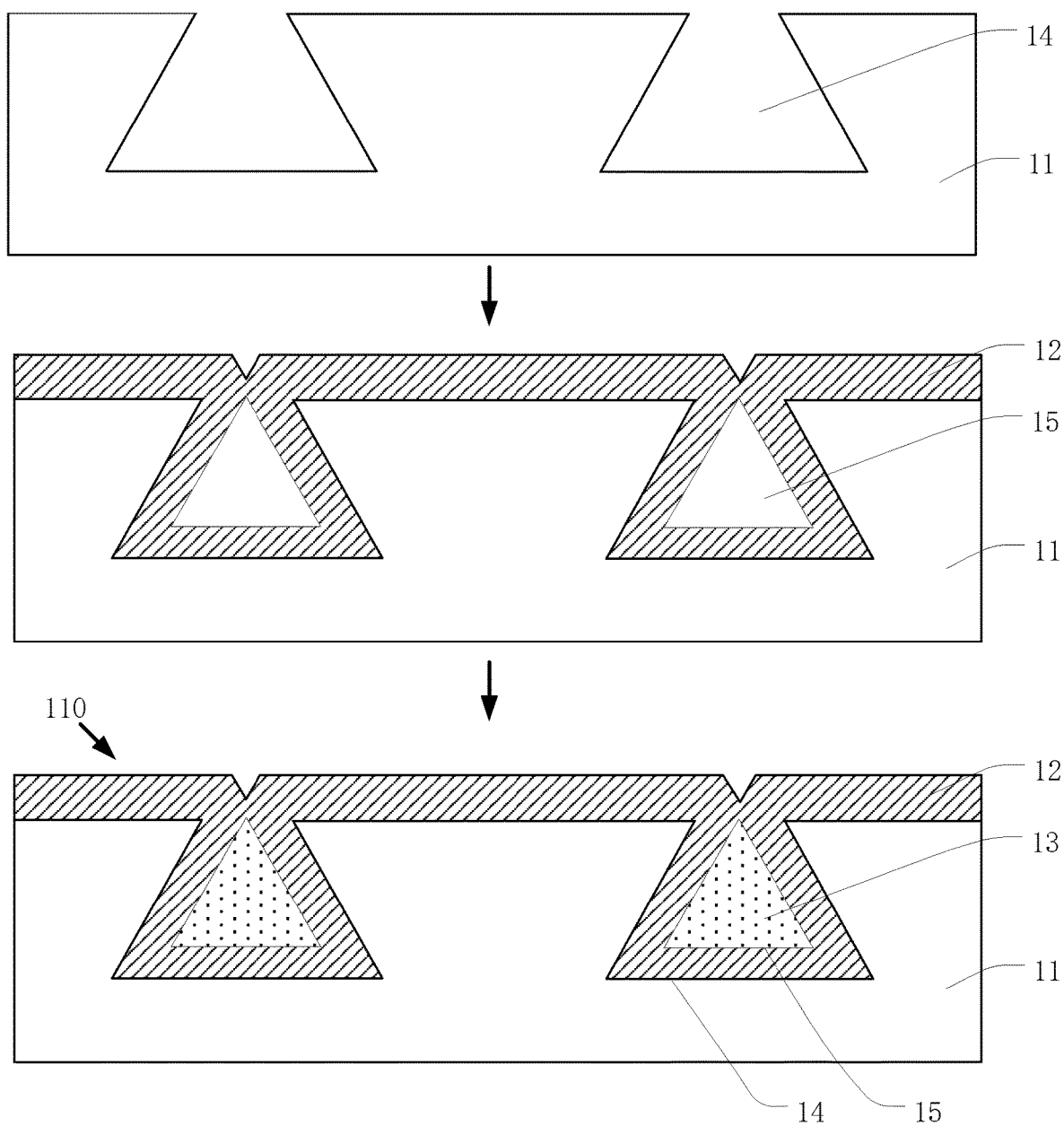
FIG. 7 is a schematic structural diagram of a buffer structure in a manufacturing process according to an embodiment of the present disclosure.

As shown in FIG. 6 and FIG. 7, an embodiment of the present disclosure provides a manufacturing method of the buffer structure 110. The method comprises following steps:

S1: preparing the first inorganic layer 11: providing the first inorganic layer 11 and disposing the trapezoidal grooves 14 at intervals on one side surface of the first inorganic layer 11 by etching, wherein the opening width of the trapezoidal grooves 14 is less than the bottom width of the grooves;

S2: preparing the second inorganic layer 12: depositing a layer of an inorganic film to from the second inorganic layer 12 on one side surface having the trapezoidal grooves 14 of the first inorganic layer 11 by an atomic layer deposition (ALD) process, a pulsed laser deposition (PLD) process, a sputtering process, or a plasma enhanced chemical vapor deposition (PECVD) process, and adjusting the thickness and the film formation parameter of the second inorganic layer 12 to make the second inorganic layer 12 connected at openings of the trapezoidal grooves 14 to form capillary channels 15, wherein the material of the second inorganic layer 12 comprises one of SiNx, SiOxNy, SiOx, SiCxNy, ZnO, or AlOx, and the thickness of the second inorganic layer 12 is 50 nm to 2500 nm; and S3: preparing an organic layer 13: using capillarity of the capillary channels 15 to add liquid organics dropwise at terminals of the capillary channels 15, the organics filling up the capillary channels 15 due to capillarity and cured by ultraviolet (UV) light to form the organic layer 13. Wherein the organics comprise epoxy resins or acrylics.

The advantage of the present disclosure is that: to provide the buffer structure 110, the display panel 100, and the manufacturing method of the buffer structure 110. It can effectively reduce the bending stress of the inorganic layers, increase bendable numbers of the display panel 100, and not affect the insulating ability of the inorganic layers to water and oxygen by using etching to form the trapezoidal grooves 14 on the inorganic film (that is the first inorganic layer 11) of the display panel 100, then deposing a layer of inorganic film (that is the second inorganic layer 12), adjusting the thickness of the inorganic film to make the inorganic film (that is the second inorganic layer 12) connected at openings of the trapezoidal grooves 14, and forming the capillary channels 15 inside the trapezoidal grooves 14, then using capillarity to make the liquid organics enter the capillary channels 15 and cured to form the organic layer 13 that the organic layer 13 penetrates between the inorganic layers (that is the first inorganic layer 11).

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A buffer structure, comprising:
   a first inorganic layer, wherein trapezoidal grooves are disposed on one side surface of the first inorganic layer at intervals, and an opening width of the trapezoidal grooves is less than a bottom width of the grooves;
   a second inorganic layer disposed on one side surface having the trapezoidal grooves of the first inorganic layer, covering inside surfaces of the trapezoidal grooves, connected at openings of the trapezoidal grooves, and forming capillary channels; and
   an organic layer filled inside the capillary channels.

2. The buffer structure according to claim 1, wherein the capillary channels are parallelly arranged linear structures or spirally arranged ring structures.

3. The buffer structure according to claim 1, wherein a spacing between the adjacent trapezoidal grooves ranges from 100 nm to 500,000 nm.

4. The buffer structure according to claim 1, wherein the opening width of the trapezoidal grooves ranges from 100 nm to 5,000 nm.

5. The buffer structure according to claim 1, wherein a thickness of the second inorganic layer ranges from 50 nm to 2,500 nm.

6. The buffer structure according to claim 1, wherein the first inorganic layer is
   a layered structure consisting of a buffer layer and an active layer, wherein the buffer layer is a single layer structure of a silicon nitride layer or a silicon oxide layer, or is a double layer structure consisting of a silicon nitride layer and a silicon oxide layer, and a material of the active layer comprises at least one of indium gallium zinc oxide, monocrystalline silicon, low temperature polysilicon, or low temperature polycrystalline oxide;
   a gate insulation layer, a material of the gate insulation layer comprises at least one of SiNx or SiOx;
   an interlayer insulation layer, a material of the interlayer insulation layer comprises SiNx or SiOx; or
   a passivation layer, a material of the passivation layer comprises SiNx or SiOx.

7. The buffer structure according to claim 1, wherein a material of the second inorganic layer comprises one of SiNx, SiOxNy, SiOx, SiCxNy, ZnO, or AlOx.

8. The buffer structure according to claim 1, wherein a material of the organic layer comprises epoxy resins or acrylics.

9. A manufacturing method of a buffer structure, comprising steps:
   preparing a first inorganic layer: providing the first inorganic layer and disposing trapezoidal grooves at intervals on one side surface of the first inorganic layer by etching, wherein an opening width of the trapezoidal grooves is less than a bottom width of the grooves;
   preparing a second inorganic layer: depositing the second inorganic layer on one side surface having the trapezoidal grooves of the first inorganic layer by an atomic layer deposition process, a pulsed laser deposition process, a sputtering process, or a plasma enhanced chemical vapor deposition process, and adjusting a thickness and a film formation parameter of the second inorganic layer to make the second inorganic layer connected at openings of the trapezoidal grooves to form capillary channels; and preparing an organic layer: using capillarity of the capillary channels to add liquid organics dropwise at terminals of the capillary channels, the organics filling up the capillary channels due to capillarity and cured by ultraviolet light to form the organic layer.

10. A display panel, comprising at least one of the buffer structures according to claim 1.

* * * * *